US012400932B2

(12) United States Patent
Asai et al.

(10) Patent No.: US 12,400,932 B2
(45) Date of Patent: Aug. 26, 2025

(54) POWER CONVERSION DEVICE WITH REFRIGERANT

(71) Applicant: HITACHI, LTD., Tokyo (JP)

(72) Inventors: Kyota Asai, Tokyo (JP); Takeshi Tokuyama, Tokyo (JP)

(73) Assignee: HITACHI, LTD., Tokyo (JP)

( * ) Notice: Subject to any disclaimer, the term of this patent is extended or adjusted under 35 U.S.C. 154(b) by 344 days.

(21) Appl. No.: 18/027,456

(22) PCT Filed: Oct. 27, 2021

(86) PCT No.: PCT/JP2021/039709
§ 371 (c)(1),
(2) Date: Mar. 21, 2023

(87) PCT Pub. No.: WO2022/102412
PCT Pub. Date: May 19, 2022

(65) Prior Publication Data
US 2023/0378025 A1    Nov. 23, 2023

(30) Foreign Application Priority Data
Nov. 13, 2020 (JP) .................................. 2020-189578

(51) Int. Cl.
*H01L 23/473* (2006.01)
*H01L 23/00* (2006.01)
(Continued)

(52) U.S. Cl.
CPC ...... *H01L 23/473* (2013.01); *H01L 23/49531* (2013.01); *H01L 23/49575* (2013.01);
(Continued)

(58) Field of Classification Search
CPC .................................................... H01L 23/473
(Continued)

(56) References Cited

U.S. PATENT DOCUMENTS

2012/0228757 A1*  9/2012  Kitami .................... H01L 23/36
                                                         257/713
2025/0079275 A1*  3/2025  Scholz .................... H01L 21/56

FOREIGN PATENT DOCUMENTS

JP    2007235060 A  *  9/2007
WO    2011064841 A1    6/2011

OTHER PUBLICATIONS

International Search Report of PCT/JP2021/039709 dated Dec. 28, 2021.

* cited by examiner

*Primary Examiner* — Ajay Arora
(74) *Attorney, Agent, or Firm* — Mattingly & Malur, PC

(57) ABSTRACT

This power conversion device comprises: first and second power circuit units each having a power semiconductor element and a plurality of conductors that hold the power semiconductor element therebetween and that are connected to an emitter and a collector of the power semiconductor element; and a flow channel forming body which houses the first and second power circuit units and through which a refrigerant flows. A conductor at the emitter side of the first power circuit unit is disposed so as to face a conductor at the collector side of the second power circuit unit. The conductor at the emitter side of the first power circuit unit and the conductor at the collector side of the second power circuit unit are connected to each other via a plurality of conductive fins which are in contact with the refrigerant.

7 Claims, 9 Drawing Sheets

(51) Int. Cl.
    *H01L 23/495*     (2006.01)
    *H01L 25/065*     (2023.01)
    *H05K 7/20*     (2006.01)

(52) U.S. Cl.
    CPC .............. *H01L 24/32* (2013.01); *H01L 24/48* (2013.01); *H01L 25/0657* (2013.01); *H05K 7/20927* (2013.01); *H01L 2224/32225* (2013.01); *H01L 2224/48237* (2013.01); *H01L 2924/1205* (2013.01); *H01L 2924/13055* (2013.01); *H01L 2924/1811* (2013.01); *H01L 2924/30107* (2013.01)

(58) Field of Classification Search
    USPC .......................................................... 257/714
    See application file for complete search history.

POWER CONVERSION DEVICE WITH REFRIGERANT

TECHNICAL FIELD

The present invention relates to a power conversion device.

BACKGROUND ART

In recent years, there is a demand for reduction in size and weight of the entirety of a vehicle with respect to an increase tendency of the amount of power converted by a power conversion device. Therefore, technological improvement for improving the output of the device while suppressing an increase in size and weight of the power conversion device is performed every day. In addition, since an in-vehicle power conversion device is used in an environment in which a temperature change is large as compared with an industrial power conversion device or the like, a device capable of maintaining high reliability even in a high-temperature environment is required.

When performing power conversion, the power conversion device needs a switching operation in which semiconductor modules constituting upper and lower arms of an inverter circuit repeat a cutoff state and a conduction state. At this time, the transient current flowing through the upper and lower arms is affected by the parasitic inductance of a wiring and becomes a cause of the surge voltage. As a result, the loss of the semiconductor module increases, and the temperature of a chip mounted therein increases. It is an important problem for a power conversion device having high reliability to achieve both reduction in inductance that causes the temperature rise and improvement in cooling performance for suppressing the temperature rise.

PTL 1 as follows is known as the background art in the present invention. A cooling structure of a semiconductor device in PTL 1 includes two semiconductor elements that holds an output electrode and are disposed to face each other, and a radiator disposed on an opposite side of the output electrode with respect to the semiconductor elements. The output electrode includes an element mounting portion and a heat transport portion. The element mounting portion is electrically connected to the two semiconductor elements and is formed of a conductive material. The heat transport portion is provided to extend from the element mounting portion toward the radiator. With such a configuration, a technique of reducing the inductance that causes the temperature rise and having excellent cooling efficiency is disclosed.

CITATION LIST

Patent Literature

PTL 1: International Publication No. 2011/064841

SUMMARY OF INVENTION

Technical Problem

In the method disclosed in PTL 1, a plurality of input electrodes is arranged in parallel, and the parasitic inductance is canceled between the input electrodes, so that it is possible to reduce the switching loss. However, since the heat transport portion is connected to the radiator via an insulating member, there is a concern that the cooling efficiency of the insulating member on a heat radiation path is lowered. In view of such circumstances, an object of the present invention is to provide a power conversion device that achieves both improvement in cooling performance by both-side cooling excluding an insulating member on a heat radiation path and reduction in inductance for suppressing a switching loss, and increases an output.

Solution to Problem

A power conversion device includes first and second power circuit units each including a power semiconductor element and a plurality of conductors that hold the power semiconductor element therebetween and that are connected to an emitter and a collector of the power semiconductor element, and a flow channel forming body which houses the first and second power circuit units and through which a refrigerant flows. The conductor at the emitter side of the first power circuit unit is disposed so as to face the conductor at the collector side of the second power circuit unit, and the conductor at the emitter side of the first power circuit unit and the conductor at the collector side of the second power circuit unit are connected to each other via a plurality of conductive fins which are in contact with the refrigerant.

Advantageous Effects of Invention

According to the present invention, it is possible to provide a power conversion device that achieves both improvement in cooling performance and reduction in inductance, and increases an output.

DESCRIPTION OF EMBODIMENTS

Embodiment of Present Invention

Figure 1:
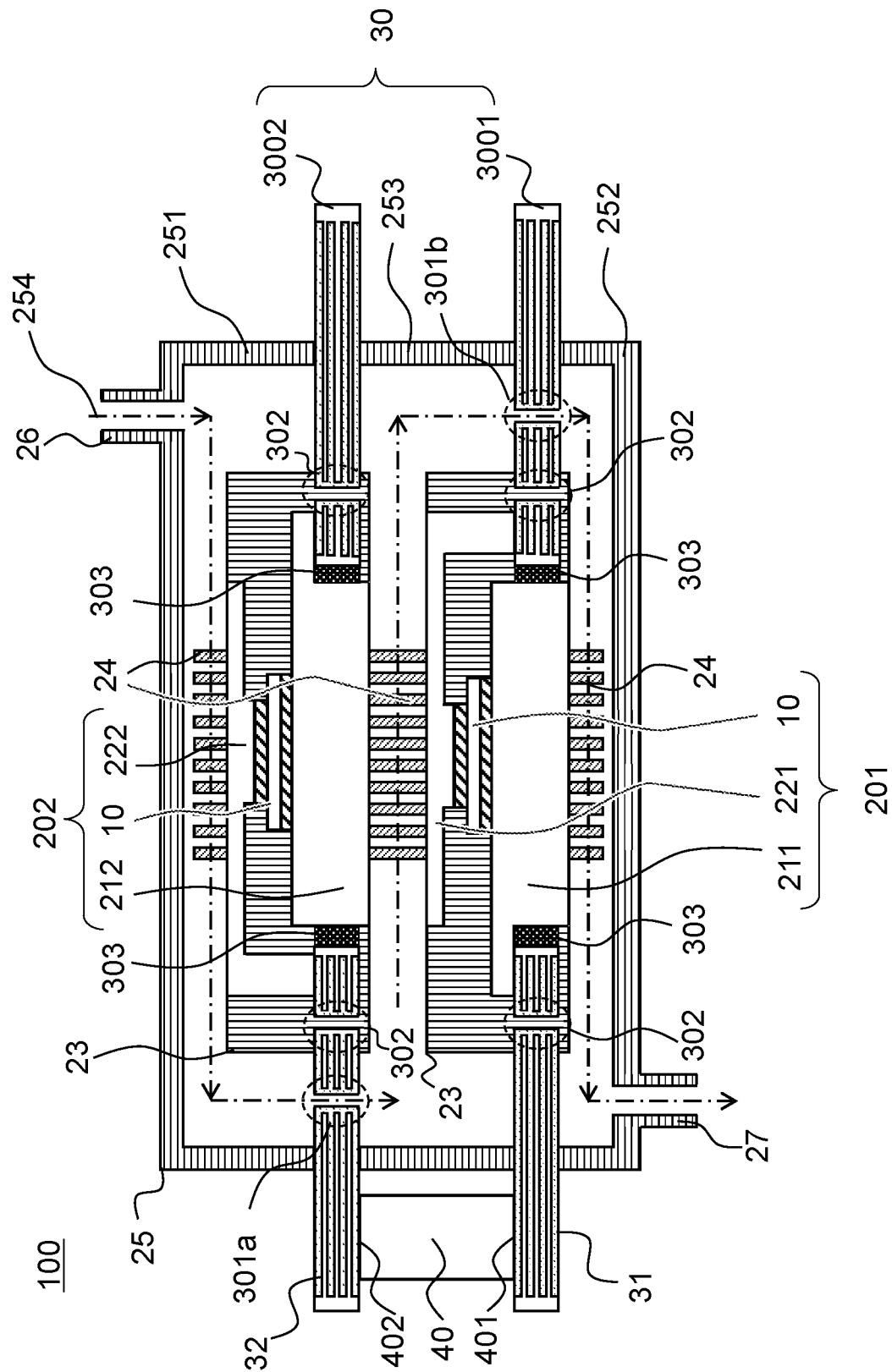
FIG. 1 is a cross-sectional view of a power conversion device according to an embodiment of the present invention.

Hereinafter, an embodiment of the present invention will be described with reference to the drawings. However, the present invention is not construed as being limited to the following embodiment, and the technical idea of the present invention may be realized by combining other known components. In the drawings, the same elements are denoted by the same reference signs, and repetitive description will be omitted.

In addition, positions, sizes, shapes, ranges, and the like of the components illustrated in the drawings may not represent actual positions, sizes, shapes, ranges, and the like in order to facilitate understanding of the invention. Therefore, the present invention is not necessarily limited to the positions, sizes, shapes, ranges, and the like illustrated in the drawings.

FIG. 1 is a cross-sectional view of a power conversion device according to an embodiment of the present invention.

A power conversion device 100 is a power conversion device that converts DC power from a battery or the like into AC power and supplies the AC power to an electric motor. FIG. 1 illustrates a configuration of an upper arm circuit and a lower arm circuit for one phase.

The power conversion device 100 includes a first board 3001 including a first power circuit unit 201, a second board 3002 including a second power circuit unit 202, a capacitor 40 that smooths a voltage applied to the power conversion device 100, and a flow channel forming body 25 through which a refrigerant that cools the entirety of the power conversion device 100 flows.

The first power circuit unit 201 connects an IGBT 10 that is a power semiconductor element, to a first power-circuit-side emitter conductor plate 221 and a first power-circuit-side collector conductor plate 211 by soldering or the like. Similarly, the second power circuit unit 202 connects the IGBT 10 that is a power semiconductor element, to a second power-circuit-side emitter conductor plate 222 and a second power-circuit-side collector conductor plate 212 by soldering or the like.

The first power circuit unit 201 and the second power circuit unit 202 each include the IGBT 10, the emitter conductor plate 221 (222), and the collector conductor plate 211 (212). In addition, the first power circuit unit 201 and the second power circuit unit 202 are installed in a power module assembly hole 303 formed to be installed in a board 30 (3001, 3002) such as a printed circuit board. The first power circuit unit 201 and the second power circuit unit 202 installed on the board 30 (3001, 3002) are sealed and fixed with a molding resin 23. This eliminates the need for a bus bar having a complicated shape and improves productivity.

The board 30 (3001, 3002) includes a plurality of conductor layers made of a copper material or the like. Portions other than the conductor layers are made of an insulating member such as a glass epoxy resin, and conductors are formed in the respective layers via vias 302. As a result, the cross-sectional area of the conductor is increased, and it is possible to reduce the inductance.

As illustrated in FIG. 1, the power conversion device 100 includes upper and lower two layers in which the first power circuit unit 201 serves as a lower layer and the second power circuit unit 202 servers as an upper layer. The flow channel forming body 25 is formed so as to cover the two power circuit units. Further, the flow channel forming body 25 includes three flow channel forming bodies of an upper-surface flow channel forming body 251, a lower-surface flow channel forming body 252, and an intermediate flow channel forming body 253.

The upper-surface flow channel forming body 251 forms a flow channel together with the second power circuit unit 202 and the second board 3002. The refrigerant flowing in the upper-surface flow channel forming body 251 flows into the inside from a flow channel inlet 26, and flows in communication with the intermediate flow channel forming body 253 through a through-hole 301a. As a result, the upper surfaces of the second power circuit unit 202 and the second board 3002 are cooled.

The intermediate flow channel forming body 253 forms a flow channel together with the second power circuit unit 202 and the second board 3002, and the first power circuit unit 201 and the first board 3001. The refrigerant flowing in the intermediate flow channel forming body 253 flows into the intermediate flow channel forming body 253 from the upper-surface flow channel forming body 251 through a through-hole 301a, and then flows in communication with the lower-surface flow channel forming body 252 through a through-hole 301b. As a result, the lower surfaces of the second power circuit unit 202 and the second board 3002 and the upper surfaces of the first power circuit unit 201 and the first board 3001 are cooled.

The lower-surface flow channel forming body 252 forms a flow channel together with the first power circuit unit 201 and the first board 3001. The refrigerant flowing into the lower-surface flow channel forming body 252 flows into the lower-surface flow channel forming body 252 from the intermediate flow channel forming body 253 through the through-hole 301b, and then is discharged to the outside of the flow channel forming body 25 through a flow channel outlet 27. As a result, the lower surfaces of the first power circuit unit 201 and the first board 3001 are cooled.

With the configuration described with reference to FIG. 1, a refrigerant path 254 is formed, and the refrigerant flows inside the flow channel forming body 25 along an arrow of the refrigerant path 254. A cooling fin 24 is provided in the middle of the refrigerant path 254 to promote heat radiation effects of the first power circuit unit 201 and the second power circuit unit 202.

The cooling fin 24 has conductivity and electrically connects the first power-circuit-side emitter conductor plate 221 and the second power-circuit-side collector conductor plate 212. As a result, it is possible to connect the power circuit units to each other at the shortest distance, which contributes to reduction in inductance. In addition, since it is not necessary to arrange the first power circuit unit 201 and the second power circuit unit 202 in parallel in a planar direction, this contributes to reduction in size of the power conversion device 100.

The capacitor 40 is installed outside the flow channel forming body 25. A positive electrode terminal 401 is connected to the first board 3001, and a negative electrode terminal 402 is connected to the second board 3002. This prevents corrosion of an electronic component due to the contact of the refrigerant.

Figure 2:
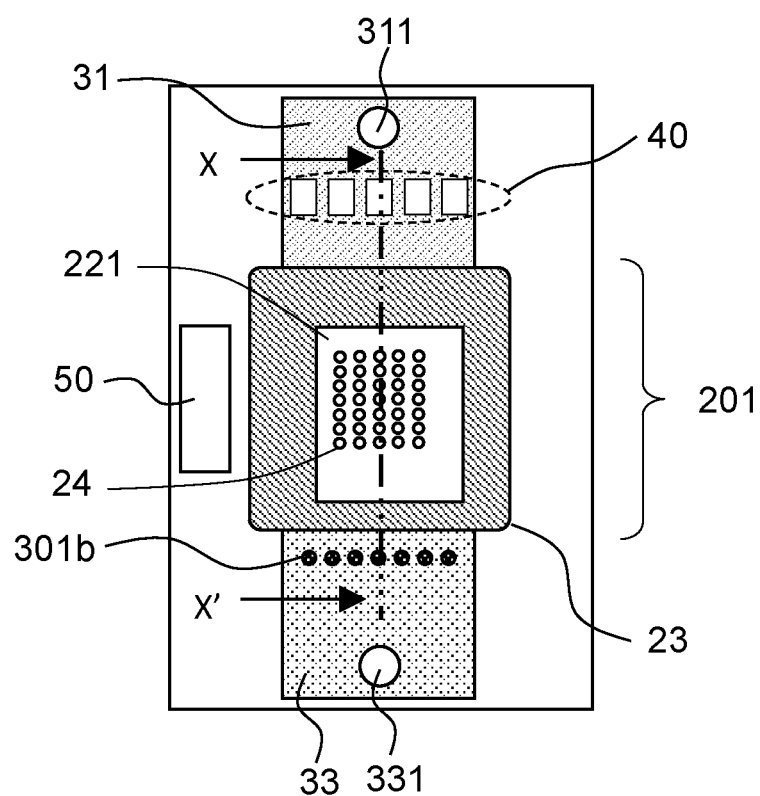
FIG. 2 is a plan view of a board (lower layer) of a first power circuit unit according to the embodiment of the present invention.

FIG. 2 is a plan view of a board (lower layer) of the first power circuit unit according to the embodiment of the present invention. X-X' is for indicating the cross-sectional position in FIG. 1.

The first board 3001 includes the first power circuit unit 201, a positive electrode power supply terminal conductor 31 including a positive electrode power supply terminal 311, an AC output terminal conductor 33 including an AC output terminal 331, and a control circuit 50 that generates a control signal.

The capacitor 40 is mounted between the first power circuit unit 201 and the positive electrode power supply terminal 311 on the first board 3001. The capacitor 40 is configured by a ceramic capacitor or the like, and a plurality of capacitors are mounted. The capacitor 40 has a positive electrode terminal 401 and a negative electrode terminal 402 (FIG. 1). The positive electrode terminal 401 is connected to the first board 3001. Since the capacitor 40 is mounted in parallel with the first power circuit unit 201, a current path from the capacitor 40 to the first power circuit unit 201 is expanded, so that it is possible to reduce the inductance.

The first power circuit unit 201 is molded by the molding resin 23, but a partial surface of the first power-circuit-side emitter conductor plate 221 is not molded and is exposed to a refrigerant flow channel. Further, a plurality of cooling fins 24 are formed on the exposed partial surface. Thus, the heat radiation effect of the first power circuit unit 201 is improved.

Figure 3:
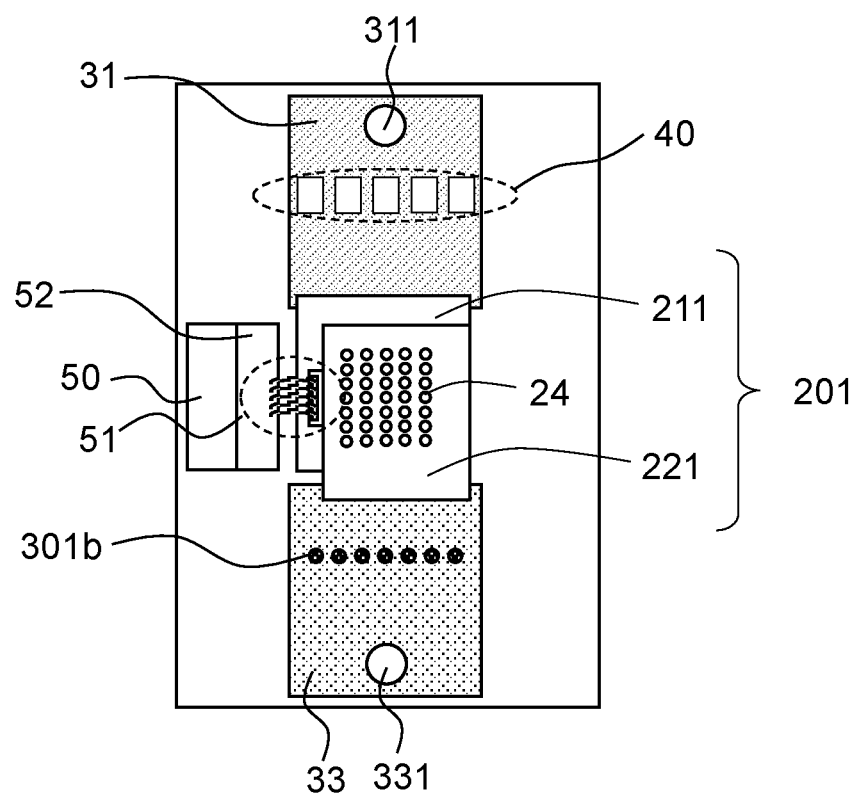
FIG. 3 is a plan view in which a molding resin is removed from FIG. 2.

FIG. 3 is a plan view in which the molding resin is removed from FIG. 2.

The control circuit 50 is disposed to be adjacent to the first power circuit unit 201, and is connected to the first power circuit unit 201 from an in-flow channel board wiring 52 via a control signal wiring 51 such as wire bonding. As a result, the inductance of the control signal wiring 51 is reduced, and a decrease in element driving performance is prevented, thereby preventing an increase in loss.

In the first board 3001, the through-hole 301b through which the refrigerant passes is provided between the first power circuit unit 201 and the AC output terminal 331. The through-hole 301b is formed in a circular shape or the like, and a plurality of through-holes are provided in parallel with the first power circuit unit 201. The through-hole 301b causes the refrigerant to communicate with all the conductor layers provided on both surfaces of the board 3001, and enables cooling of both surfaces of the first power circuit unit 201.

Figure 4:
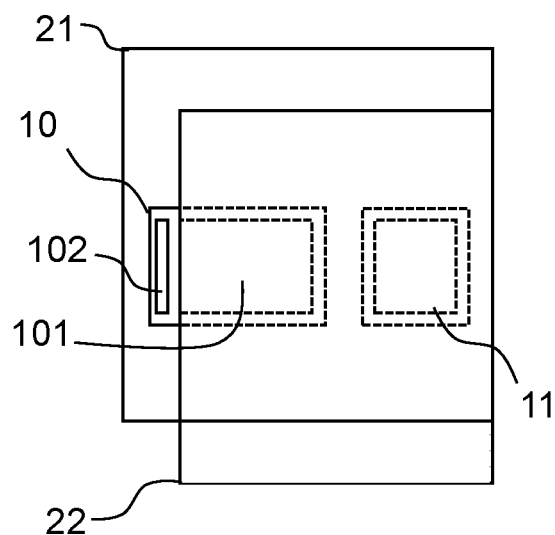
FIG. 4 is a plan view of a power module.
Figure 5:
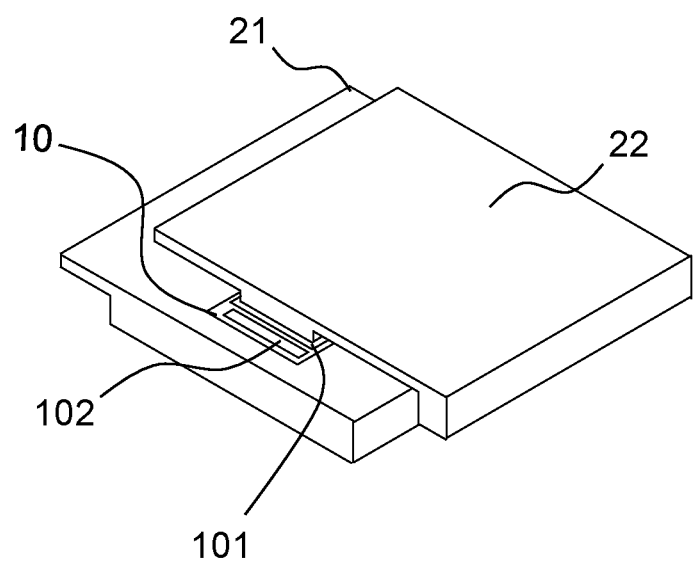
FIG. 5 is a perspective view of the power module.
Figure 6:
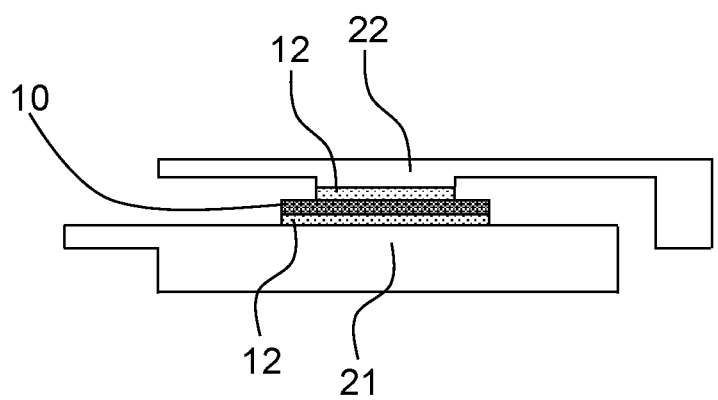
FIG. 6 is a front view of the power module.

FIG. 4 is a plan view of the power module, FIG. 5 is a perspective view thereof, and FIG. 6 is a front view thereof.

The power module 20 constitutes the upper arm circuit or the lower arm circuit for one phase in the power conversion device that converts DC power into AC power. The power module 20 includes an IGBT 10, a diode 11, a collector conductor plate 21, and an emitter conductor plate 22.

The IGBT 10 includes a plate-shaped main electrode 101 and a control electrode 102 that controls a main current flowing through the main electrode 101. The collector conductor plate 21 and the emitter conductor plate 22 are made of a copper material. The IGBT 10 and the diode 11 are sandwiched from both surfaces by the collector conductor plate 21 and the emitter conductor plate 22. The IGBT 10 and the diode 11 are connected to the collector conductor plate 21 and the emitter conductor plate 22 via a metal bonding material 12 such as solder.

In the power conversion device 100 in the present embodiment, each of the first power circuit unit 201 and the second power circuit unit 202 is configured by the power module 20 having the above-described structure. In the first power circuit unit 201, the collector conductor plate 21 and the emitter conductor plate 22 correspond to the first power-circuit-side collector conductor plate 211 and the first power-circuit-side emitter conductor plate 221, respectively. In the second power circuit unit 202, the collector conductor plate 21 and the emitter conductor plate 22 correspond to the second power-circuit-side collector conductor plate 212 and the second power-circuit-side emitter conductor plate 222, respectively. In FIG. 1, the diode 11 is not illustrated.

Figure 7:
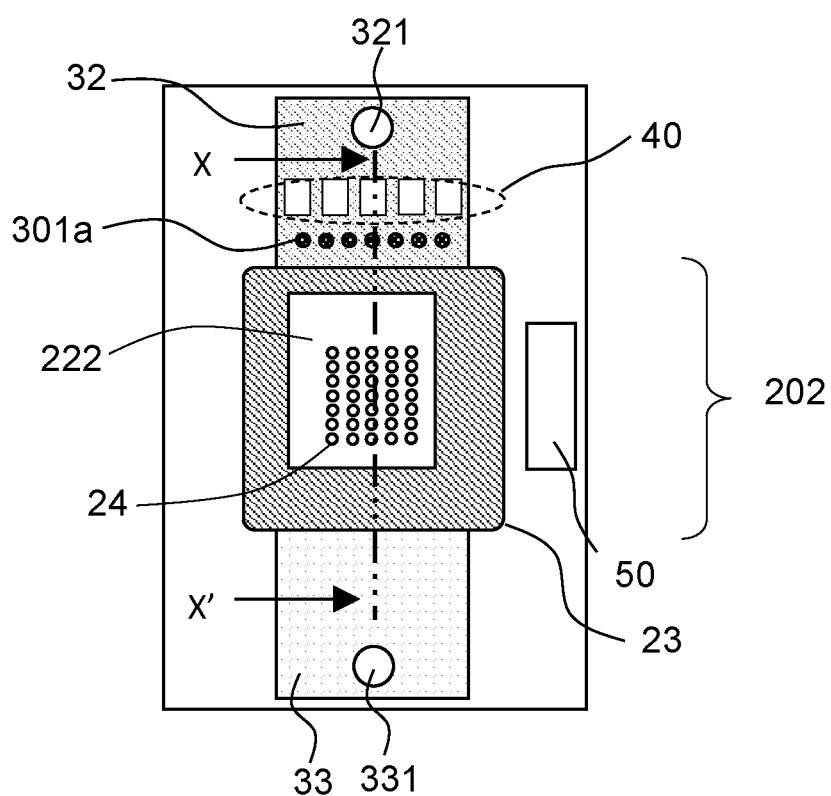
FIG. 7 is a plan view of a board (upper layer) of a second power circuit unit according to the embodiment of the present invention.
Figure 8:
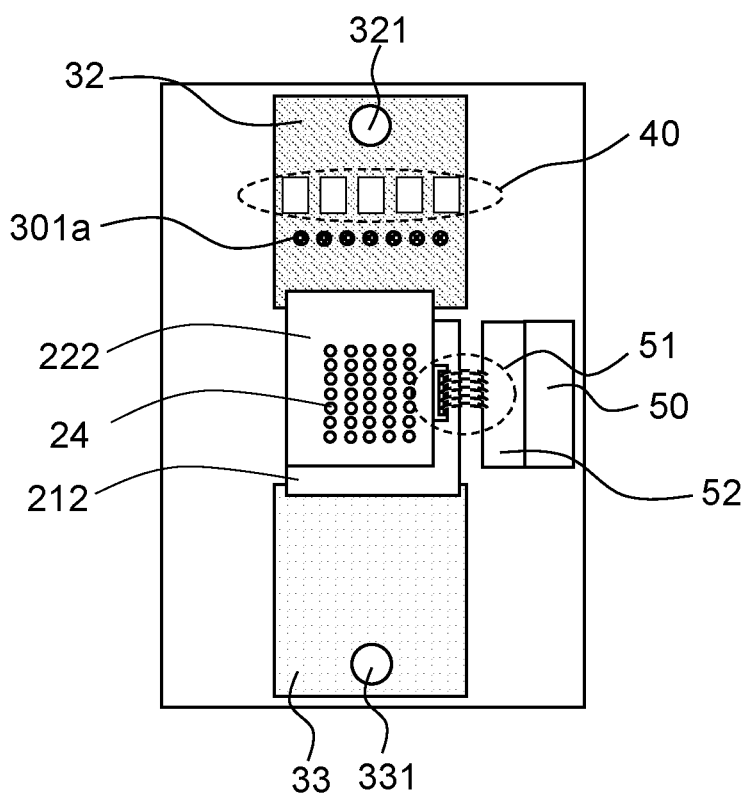
FIG. 8 is a plan view in which the molding resin is removed from FIG. 7.

FIG. 7 is a plan view of a board (upper layer) of the second power circuit unit according to the embodiment of the present invention. X-X' is for indicating the cross-sectional position in FIG. 1.

The second board 3002 includes the second power circuit unit 202, a negative electrode power supply terminal conductor 32 including a negative electrode power supply terminal 321, an AC output terminal conductor 33 including an AC output terminal 331, and a control circuit 50 that generates a control signal. A plurality of through-holes 301a through which the refrigerant passes are provided between the second power circuit unit 202 and the negative electrode power supply terminal 321, in parallel to the second power circuit unit 202.

Although the second board 3002 is formed with the same structure as the first board 3001, the dispositions and the structures of the first board 3001 and the second board 3002 will be described in comparison with each other by using FIGS. 2 and 7. The first board 3001 illustrated in FIG. 2 and the second board 3002 illustrated in FIG. 7 have point-symmetrical shapes except for the disposition of the capacitor 40. That is, the positive electrode power supply terminal conductor 31 of the first board 3001 corresponds to the AC output terminal conductor 33 of the second board 3002, and the AC output terminal conductor 33 of the first board 3001 corresponds to the negative electrode power supply terminal conductor 32 of the second board 3002. As described above, since the upper and lower arms constituting the power conversion device 100 are manufactured with the same shape and structure, productivity is improved.

Furthermore, as illustrated in FIG. 1, by disposing the first board 3001 and the second board 3002 in an overlapping manner in the form of upper and lower layers, it is possible to simultaneously realize shortening of a wiring path and cooling by the refrigerant flowing in the flow channel forming body 25. Therefore, this contributes not only to the effect of increasing the output by achieving both the improvement in the cooling performance and the reduction in the inductance, but also to the reduction in the size of the entire device.

In the second board 3002, the second power-circuit-side collector conductor plate 212 is disposed so as to face the first power-circuit-side emitter conductor plate 221, and the first power-circuit-side emitter conductor plate 221 and the second power-circuit-side collector conductor plate 212 are connected to each other by the plurality of conductive cooling fins 24 (FIG. 1). As a result, the disposition in which the IGBT 10 of the first power circuit unit 201 faces the diode 11 of the second power circuit unit 202, and the diode 11 of the first power circuit unit 201 faces the IGBT 10 of the second power circuit unit 202 is obtained. With such a configuration, the transient current path at the switching time of the power conversion device 100 is shortened, and the counter currents flow through the first power circuit unit 201 and the second power circuit unit 202, so that the inductance is reduced.

The capacitor 40 is located between the second power circuit unit 202 and the negative electrode power supply terminal 321 on the second board 3002. The negative electrode terminal 402 of the capacitor 40 is connected to the second board 3002, and the negative electrode terminal 402 is disposed to face the positive electrode terminal 401 (FIG. 1). As a result, a current path flowing out from the capacitor 40 to the first power circuit unit 201 faces a current path flowing into the capacitor 40 from the second power circuit unit 202, and it is possible to reduce the inductance.

Further, in the configuration described above, in the power conversion device 100, electric energy necessary for driving the electric motor is supplied from the battery to the first power circuit unit 201 and the second power circuit unit 202, and the AC power output from the AC output terminal 331 provided in the AC output terminal conductor 33 is controlled. At the switching time of the power conversion device 100, the current flowing out of the positive electrode terminal 401 of the capacitor 40 flows from the first power circuit unit 201 into the second power circuit unit 202 via the conductive cooling fin 24, and then flows into the negative electrode terminal 402. As a result, the transient current path at the switching time is shortened, and the inductance is reduced.

Furthermore, a heat radiation path is formed from the semiconductor elements (IGBT 10 and diode 11) of the first power circuit unit 201 and the second power circuit unit 202 to the conductive cooling fins 24 without an insulating member interposed therebetween, and the heat radiation path is directly cooled by the refrigerant such as oil, so that it is possible to suppress an increase in thermal resistance and increase the output of the power conversion device 100. In addition, by providing the through-holes 301*a* and 301*b* close to the molding resin 23, it is possible to shorten the refrigerant path 254 and to achieve both the reduction in pressure loss and the improvement in cooling efficiency.

Figure 9:
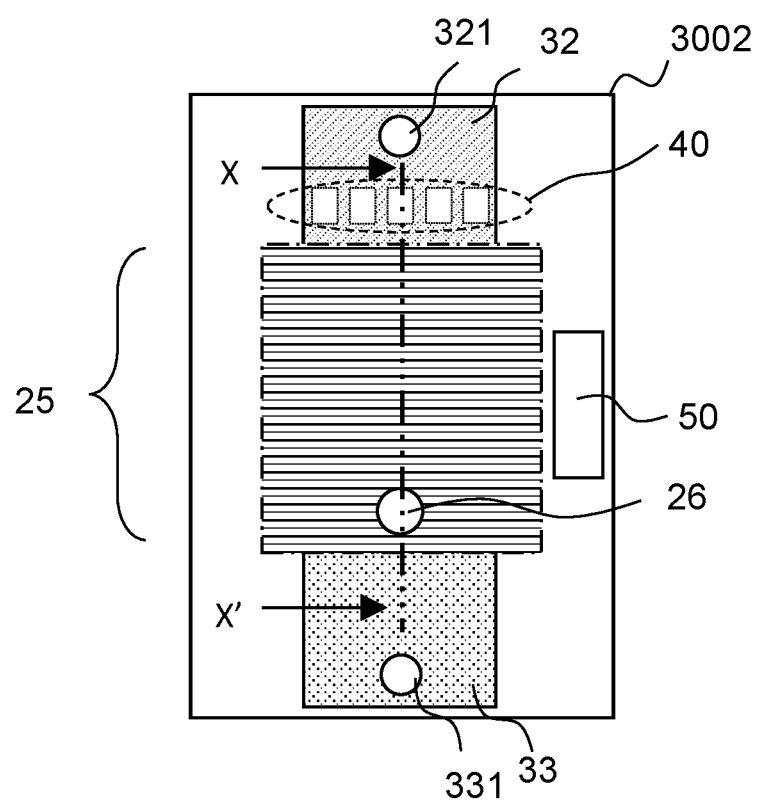
FIG. 9 is a top view of the power conversion device according to the embodiment of the present invention.

FIG. 9 is a top view of the power conversion device according to the embodiment of the present invention. X-X' is for indicating the cross-sectional position in FIG. 1.

The flow channel forming body 25 is provided so as to surround the molding resin 23 and the through-holes 301*a* and 301*b*. The capacitor 40 and the control circuit 50 are formed outside the flow channel forming body 25. This makes it possible to prevent corrosion of the electronic component due to the contact of the refrigerant. On the other hand, the first power circuit unit 201, the second power circuit unit 202, and the control signal wiring 51 are configured in a flow channel forming area, but are not electrically affected by the contact of the refrigerant by the molding resin 23.

According to the above-described embodiment of the present invention, the advantageous effects as follows are exhibited.

(1) A power conversion device 100 includes: first and second power circuit units 201 and 202 each including an IGBT 10 that is a power semiconductor element and a plurality of conductor (first power-circuit-side emitter conductor plate 221, first power-circuit-side collector conductor plate 211, second power-circuit-side emitter conductor plate 222, and second power-circuit-side collector conductor plate 212) that hold the IGBT 10 therebetween and that are respectively connected to an emitter and a collector of the IGBT 10, and a flow channel forming body 25 that houses the first and second power circuit units 201 and 202 and through which a refrigerant flows. The conductor 221 at the emitter side of the first power circuit unit 201 is disposed to face the conductor 212 at the collector side of the second power circuit unit 202, and the conductor 221 at the emitter side of the first power circuit unit 201 and the conductor 212 at the collector side of the second power circuit unit 202 are connected to each other via a plurality of conductive cooling fins 24 which are in contact with the refrigerant. With this configuration, it is possible to provide a power conversion device that achieves both improvement in cooling performance and reduction in inductance, and increases an output.

(2) The power semiconductor element includes an IGBT 10 and a diode 11. The IGBT 10 of the first power circuit unit 201 is disposed to face the diode 11 of the second power circuit unit 202, and the diode 11 of the first power circuit unit 201 is disposed to face the IGBT 10 of the second power circuit unit 202. With this configuration, it is possible to reduce the inductance.

(3) The flow channel forming body 25 includes an upper-surface flow channel forming body 251 that forms a flow channel on an upper surface of the first power circuit unit 201, a lower-surface flow channel forming body 252 that forms a flow channel on a lower surface of the second power circuit unit 202, and an intermediate flow channel forming body 253 that forms a flow channel between the first and second power circuit units 201 and 202. With this configuration, it is possible to simultaneously cool the power circuit units 201 and 202 of the upper and lower layers while communicating the refrigerant.

(4) The first and second power circuit units 201 and 202 are mounted respectively on a first board 3001 and a second board 3002 each including a conductor layer electrically connected to the conductor. With this configuration, it is possible to suppress the sizes in a height direction of the first and second power circuit units 201 and 202 disposed as the upper and lower layers.

(5) The first board 3001 and the second board 3002 are configured in the same shape. With this configuration, the productivity is improved.

(6) The conductor layers of the first board 3001 and the second board 3002 are disposed to face each other, and are connected respectively to a positive electrode terminal 401 and a negative electrode terminal 402 of a capacitor 40 disposed outside the flow channel forming body 25. With this configuration, the transient current path at the switching time is shortened, and the inductance is reduced.

(7) The flow channels in the upper-surface flow channel forming body 251 and the lower-surface flow channel forming body 252 are electrically connected to each other via a flow channel in the intermediate flow channel forming body 253. With this configuration, it is possible to simultaneously cool the power circuit units 201 and 202 of the upper and lower layers.

Although the present invention has been described above, an RC-IGBT may be applied to the IGBT 10, which can further contribute to the reduction in loss of the semiconductor element for improving the fuel consumption of an HEV or an EV and to the reduction in size of the power conversion device 100.

In addition, deletion, replacement with another component, and addition of another component can be performed without departing from the technical idea of the invention, and an aspect thereof is also included in the scope of the present invention.

REFERENCE SIGNS LIST

10 IGBT
101 main electrode
102 control electrode
11 diode
12 metal bonding material
20 power module
201 first power circuit unit
202 second power circuit unit
21 collector conductor plate
211 first power-circuit-side collector conductor plate
212 second power-circuit-side collector conductor plate
22 emitter conductor plate
221 first power-circuit-side emitter conductor plate
222 second power-circuit-side emitter conductor plate
23 molding resin
24 conductive fin
25 flow channel forming body
251 upper-surface flow channel forming body
252 lower-surface flow channel forming body
253 intermediate flow channel forming body
254 refrigerant path
26 flow channel inlet
27 flow channel outlet
30 board
301*a*, 301*b* through-hole
302 via
303 power module assembly hole 3001 first board
3002 second board
31 positive electrode power supply terminal conductor
311 positive electrode power supply terminal
32 negative electrode power supply terminal conductor
321 negative electrode power supply terminal
33 AC output terminal conductor
331 AC output terminal
40 capacitor
401 positive electrode terminal
402 negative electrode terminal
50 control circuit
51 control signal wiring
52 in-flow channel board wiring
100 power conversion device

The invention claimed is:

1. A power conversion device comprising:
   first and second power circuit units each including a power semiconductor element and a plurality of conductors that hold the power semiconductor element therebetween and that are connected to an emitter and a collector of the power semiconductor element; and
   a flow channel forming body which houses the first and second power circuit units and through which a refrigerant flows, wherein
   the conductor at an emitter side of the first power circuit unit is disposed so as to face the conductor at a collector side of the second power circuit unit, and
   the conductor at the emitter side of the first power circuit unit and the conductor at the collector side of the second power circuit unit are connected to each other via a plurality of conductive fins which are in contact with the refrigerant.

2. The power conversion device according to claim 1, wherein
   the power semiconductor element includes an IGBT and a diode, the IGBT of the first power circuit unit is disposed to face the diode of the second power circuit unit, and the diode of the first power circuit unit is disposed to face the IGBT of the second power circuit unit.

3. The power conversion device according to claim 1, wherein
   the flow channel forming body includes an upper-surface flow channel forming body that forms a flow channel on an upper surface of the first power circuit unit, a lower-surface flow channel forming body that forms a flow channel on a lower surface of the second power circuit unit, and an intermediate flow channel forming body that forms a flow channel between the first and second power circuit units.

4. The power conversion device according to claim 1, wherein
   the first and second power circuit units are mounted respectively on a first board and a second board each including a conductor layer electrically connected to the conductor.

5. The power conversion device according to claim 4, wherein
   the first board and the second board are configured in a same shape.

6. The power conversion device according to claim 5, wherein
   the conductor layers of the first board and the second board are disposed to face each other, and are connected respectively to a positive electrode terminal and a negative electrode terminal of a capacitor disposed outside the flow channel forming body.

7. The power conversion device according to claim 3, wherein
   flow channels in the upper-surface flow channel forming body and the lower-surface flow channel forming body are electrically connected to each other via a flow channel in the intermediate flow channel forming body.

* * * * *